(12) United States Patent
Bourdillon

(10) Patent No.: US 6,876,036 B2
(45) Date of Patent: Apr. 5, 2005

(54) DEVICE FOR MEASURING PARAMETERS OF AN ELECTRONIC DEVICE

(75) Inventor: Laurence A. Bourdillon, New Milford, CT (US)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 10/202,246

(22) Filed: Jul. 24, 2002

(65) Prior Publication Data

US 2003/0016047 A1 Jan. 23, 2003

Related U.S. Application Data

(62) Division of application No. 09/633,761, filed on Aug. 7, 2000, now Pat. No. 6,433,573.

(51) Int. Cl.⁷ .................... H01L 27/01; H01L 27/12; H01L 31/0392

(52) U.S. Cl. .................... 257/347; 257/350; 257/351

(58) Field of Search .................... 257/347, 350, 257/351

(56) References Cited

U.S. PATENT DOCUMENTS 5,686,735 A * 11/1997 Sim .......................... 257/24

* cited by examiner

*Primary Examiner*—Thien F Tran
(74) *Attorney, Agent, or Firm*—Aaron Waxler

(57) ABSTRACT

The inherent capacitance between the substrate and the drain of an SOI device is utilized as part of a circuit. The substrate is connected to a sensing pin brought external to the chip, and other electronic components are hooked up to form a circuit that includes and operates with the inherent capacitance between the substrate and the drain.

7 Claims, 3 Drawing Sheets

DEVICE FOR MEASURING PARAMETERS OF AN ELECTRONIC DEVICE

CROSS REFERENCE TO RELATED APPLICATIONS

This is a divisional of application Ser. No. 09/633,761, filed Aug. 7, 2000 now U.S. Pat. No. 6,433,573.

TECHNICAL FIELD

This invention relates to electronics, and more specifically, to an improved technique of measuring parameters within Silicon on Insulator (SOI) and similar devices.

BACKGROUND OF THE INVENTION

FIG. 1 shows an exemplary prior art configuration of two semiconductor devices 102 and 103 configured with other elements to form a half bridge circuit. The devices may be MOS devices, SOI, or other type. The devices are typically manufactured using known techniques in which the various required layers are deposited on a substrate 201 as shown in FIG. 2. Devices 102 and 103 are each usually fabricated on a chip, and border 125 represents the external boundaries of the chips.

As FIG. 1 shows, one standard application includes the use of external capacitors 105 and 106 in order to measure the output of the half bridge. A sensing lead 107 is usually connected outside of the chip on which the SOI devices 102 and 103 reside. The sensing lead may be measured using standard equipment. The remainder of the external elements, inductor 108, capacitors 109 and 115 and resistor 110, are arranged to form a standard resonant output circuit.

In operation, high voltage capacitor 105 transfers AC signals to sensing lead 107 and such signals are sent to a measurement device in order to monitor operation of the SOI devices from an external piece of equipment. While the arrangement is basically satisfactory, the use of external components increases the cost and decreases the reliability.

The external monitoring is required in a variety of applications. For example, it is desirable in some switching circuits to maintain operation of the device in what is termed the soft switching region. The only way to accomplish this objective is to monitor the operation of the device and provide correction if the hard switching region is approached.

In view of the foregoing, it would be desirable to construct a sensing apparatus that does not require so many additional components. It would also be desirable to minimize manufacturing costs of such devices. It is also a desirable object to eliminate the need for an additional external capacitor.

SUMMARY OF THE INVENTION

The above and other problems of the prior art are overcome in accordance with the present invention, which relates to a technique of implementing the required capacitor for sensing without the additional cost and connections typically required in the prior art. More specifically, a separate sensing lead is run from the substrate of the device to an external pin. The inherent residual capacitance between the substrate and the drain is utilized as the sensing capacitor. This residual capacitance is usually deemed an unwanted parasitic capacitance. Applications include utilizing this internal sensing capacitor to control logic gates, to regulate or control external devices, or to maintain a device in the soft switching region. In alternative embodiments, the inherent capacitance between the substrate and other portions of the device (e.g. the gate or the source) may also be used.

DETAILED DESCRIPTION OF THE PREFERRED EMBODIMENT

Figure 2:
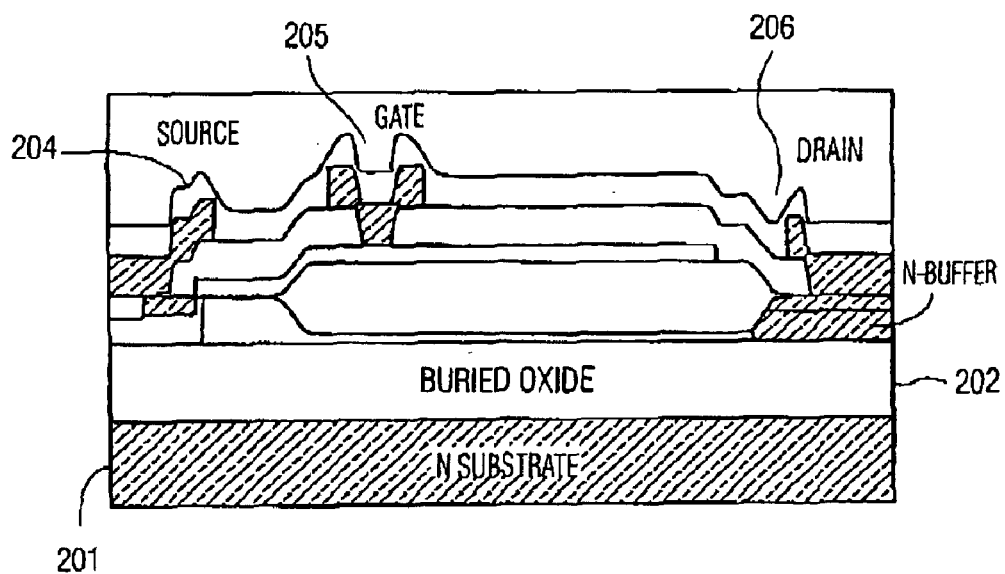
FIG. 2 represents a cross section of the physical structure of an SOI device.

FIG. 2 shows a cross section of a typical SOI device including a substrate layer 201, and a buried oxide layer 202. The remaining layers are shown in accordance with standard manufacturing techniques for such devices. The device includes a source 204, a gate 205, and a drain 206. There are a variety of such devices commercially available, and the particular specific device utilized is not critical to the present invention.

Figure 3:
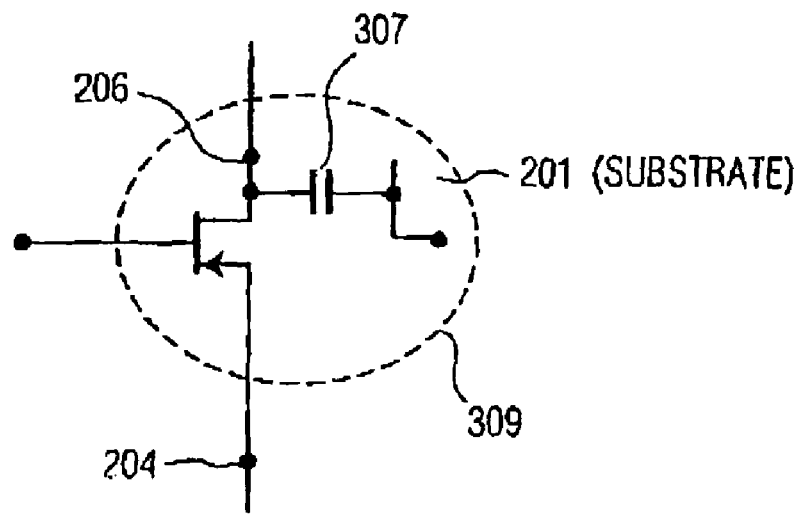
FIG. 3 depicts an exemplary prior art arrangement showing the conventional internal connection of the source to the drain.

In typical applications, the substrate layer 204 is connected directly to the source layer as indicated pictorially in FIG. 3. Such a connection is internal to a semiconductor chip, as shown in FIG. 3, the dashed border 309 representing the outer boundaries of the device. Often, a single outer package will include three terminals, representing the source, gate and drain, and a small tab also connected to the drain.

Figure 1:
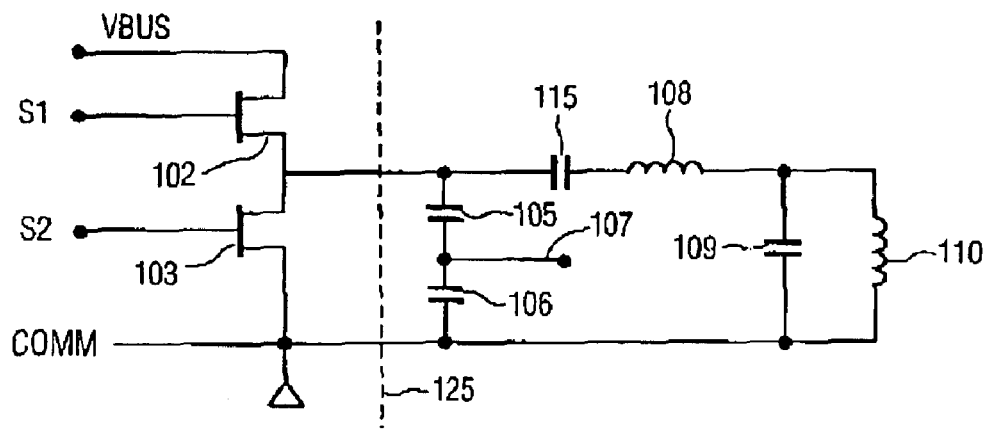
FIG. 1 is an example of a prior art arrangement with an SOI device and several external capacitors.

The use of the external capacitors 105 and 106 in FIG. 1 fails to take advantage of the inherent capacitance between the substrate 201 and the drain 206, as indicated as capacitance 307 in FIG. 3. This capacitance is simply a result of the physics inherent in the production of these devices, the size thereof, and other parameters. The inherent capacitance 307 is readily calculable by those of skill in the art and exists on the device without any additional cost. The value of capacitor 307 depends upon the size of the drain, the area of the substrate 201 of FIG. 2, and the area of the buried oxide layer 202.

More specifically, referring to FIG. 2, the capacitance is formed because the buried oxide layer 202 acts as an insulator between the drain 208 and substrate 201. The drain 208 and substrate 201 then act as the plates of a capacitor. Thus, the standard equations for calculating the capacitance of a parallel plate capacitor may be used.

It is noted that there also exists an inherent capacitance between the substrate layer 201 and any other portions of the device above buried oxide layer 202. The drain/substrate capacitance was chosen to utilize because the typical area of the drain is large enough to provide a higher valued capacitor, which is typically what is needed in the measurement circuitry to ensure operation within the soft switiching region. We therefore use herein as the example for explantion purpose the drain substrate capaitance. However, the present invention is not intended to exclude use of the substrate/gate capacitance, or the substrate/source capacitance as valuable measurement elements.

Figure 4:
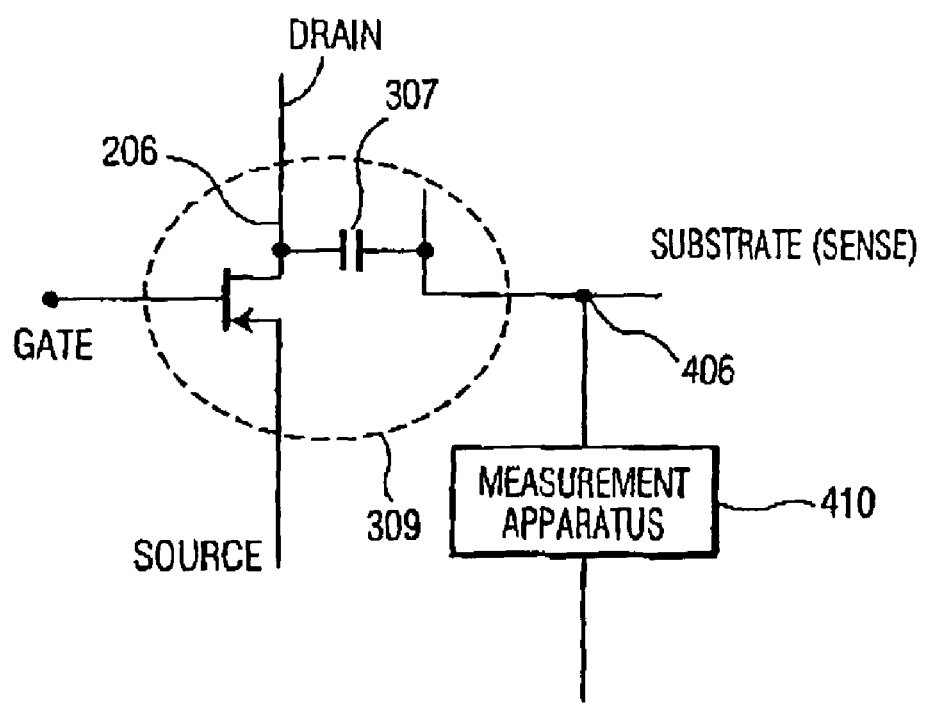
FIG. 4 shows an exemplary arrangement of a device connected in accordance with the present invention.

As indicated in FIG. 4, the present invention contemplates that the source and substrate will not be internally connected. Instead, a separate pin is taken from the substrate out to the outside of the device for measurement purposes. One convenient technique involves the use of a small tab on the outside of the device package. More specifically, the tab on the outside of parts such as a standard T0-220, sometimes used as a heat sink and often connected to the drain, may be connected to the substrate instead of to the drain. This allows conventional device packaging to be utilized with no modification.

As shown in FIG. 4, the sense pin 406 may then be connected external to the device to a measurement apparatus. The measurement apparatus 410 is connected to the sense 406 and to a common ground. Since the capacitor 307 passes varying signals but suppresses DC, the substrate sense 406 of FIG. 4 is a signal that represents the derivative of the drain voltage.

The drain/substrate capacitance 307 is thus utilized as a sensing mechanism. More specifically, the current out of the capacitor 307 is a measure of the change in voltage at the drain 206 with respect to time. Since this inherent capacitor provides the necessary signal, the external capacitor 105 can be eliminated.

Figure 5:
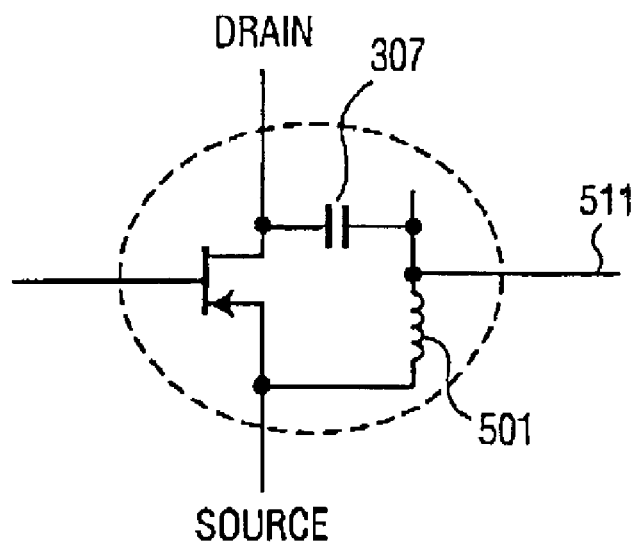
FIG. 5 shows a further exemplary embodiment of the present invention.

FIG. 5 shows an embodiment of the present invention in which a resistor 501 is placed in series with the internal capacitance 307. The resistor is fabricated on the chip with the SOI device in accordance with conventional techniques for depositing a resistor. A sensing pin 511 is then brought external to the chip, and the sensing pin represents a voltage division between capacitor 307 and internal resistor 501. Thus, in the embodiment of FIG. 5, the inherent capacitance 307 is used as part of a voltage divider circuit.

Figure 6:
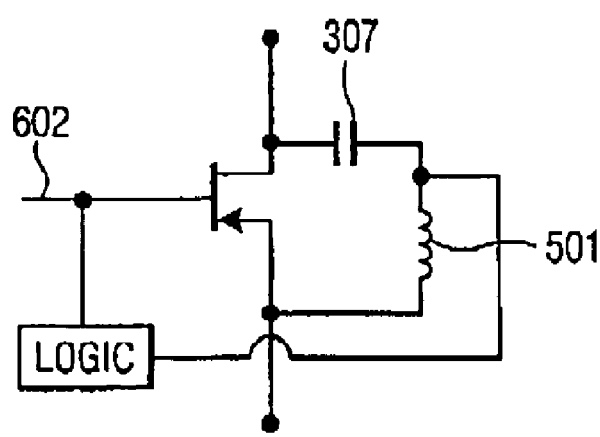
FIG. 6 depicts the use of the present invention in conjunction with one or more external logic gates.

FIG. 6 shows still another exemplary embodiment of the present invention comprising the inherent capacitance 307 in series with the internal resistor 501 previously discussed. This time a set of logic 601 is added to the sensing point to control an output present at pin 602. The logic receives a signal proportional to the rate of change of voltage across capacitor 307. The logic may be used to control that gate (e.g., shut it off if the change in voltage is too rapid). Note that logic 601 may include one or more logic gates and functions on the chip or external thereto.

While the above discussion is with respect to the inherent capacitance between the drain and the substrate, there is also a capacitance between the substrate and the gate, as well as between the substrate and the source. These lower capacitances are available as well by virtue of the fact that the substrate is brought via a pin 406 of FIG. 4 to a point external to the device.

While the above describes the preferred embodiment of the invention, various modifications/additions will be apparent to those of skill in the art. More specifically, the arrangements utilized both externally and internally with respect to the present invention may vary. The sense pin 406 or 511 bringing the substrate 201 outside the chip may be connected to a variety of different capacitors, resistors or other electronic components. The control circuitry for varying operation of the device based upon measured parameters may vary from that shown herein, and other uses of the sense pin may be employed by those of ordinary skill in the art. All of the foregoing are intended to be covered by the following claims.

What is claimed:

1. An electronic device having a source, a gate and a drain, said electronic device being on a substrate, said electronic device and substrate being within a chip having external pins, said substrate being connected electrically to an external pin and not being connected to said source, and wherein a capacitance between the drain and the substrate further comprises a sensing mechanism.

2. The device of claim 1 further comprising a resistor connected between said substrate and said source, said resistor being internal to said chip.

3. The device of claim 2 wherein said resistor is connected at a common point to said substrate and to at least one logic gate for monitoring electrical activity at said point.

4. A semiconductor device comprising a conducting substrate layer, a semiconductor layer on the substrate layer, and a drain, said semiconductor device being on a chip and including a pin connected to the substrate layer and not to a source and extending to a point external to said chip, and wherein a capacitance between the drain and the substrate further comprises a sensing mechanism.

5. The semiconductor of claim 4 further comprising at least one logic gate connected to said point external to said chip.

6. The semiconductor device of claim 4 further comprising a resistor on said chip and connected between said source and said substrate.

7. The semiconductor device of claim 6 further comprising a measuring apparatus connected thereto.

* * * * *